United States Patent [19]

Keller

[11] 4,039,283

[45] Aug. 2, 1977

[54] APPARATUS FOR PRODUCING A CONTROLLED RADIAL PATH OF RESISTANCE IN A SEMICONDUCTOR MONOCRYSTALLINE ROD

[75] Inventor: Wolfgang Keller, Munich, Germany

[73] Assignee: Siemens Aktiengesellschaft, Berlin & Munich, Germany

[21] Appl. No.: 606,854

[22] Filed: Aug. 22, 1975

Related U.S. Application Data

[62] Division of Ser. No. 460,539, April 12, 1974, Pat. No. 3,976,536.

[30] Foreign Application Priority Data

Apr. 18, 1973   Germany ............................. 2319700

[51] Int. Cl.² ............................................. B01J 17/10
[52] U.S. Cl. ................................ 23/273 SP; 156/606; 156/620
[58] Field of Search ....................... 23/273 SP, 273 Z; 156/606, 605, 620, 619, 617

[56] References Cited

U.S. PATENT DOCUMENTS

| | | | |
|---|---|---|---|
| 2,907,642 | 10/1959 | Rummel | 156/615 X |
| 2,914,397 | 11/1959 | Sterling | 156/620 UX |
| 3,002,824 | 10/1961 | Francois | 156/604 X |
| 3,232,716 | 2/1966 | Quast et al. | 156/618 X |
| 3,234,009 | 2/1966 | Siebertz | 156/619 |
| 3,293,002 | 12/1966 | Spielmann et al. | 156/619 |
| 3,442,622 | 5/1969 | Monnier et al. | 156/606 |
| 3,804,682 | 4/1974 | Keller | 156/606 |

OTHER PUBLICATIONS

O'Connor et al., "Growth of Silicon and Germanium Disks," J. Applied Physics, vol. 29, No. 2, p. 222, (Feb. 1957).

Primary Examiner—Norman Yudkoff
Assistant Examiner—Barry I. Hollander
Attorney, Agent, or Firm—Hill, Gross, Simpson, Van Santen, Steadman, Chiara & Simpson

[57] ABSTRACT

An apparatus for controlling a radial path of resistance in a semiconductor monocrystalline rod produced by a crucible-free zone melting whereby the material flow path and heat distribution in the melt zone is controlled by a guided stream of protective gas.

2 Claims, 6 Drawing Figures

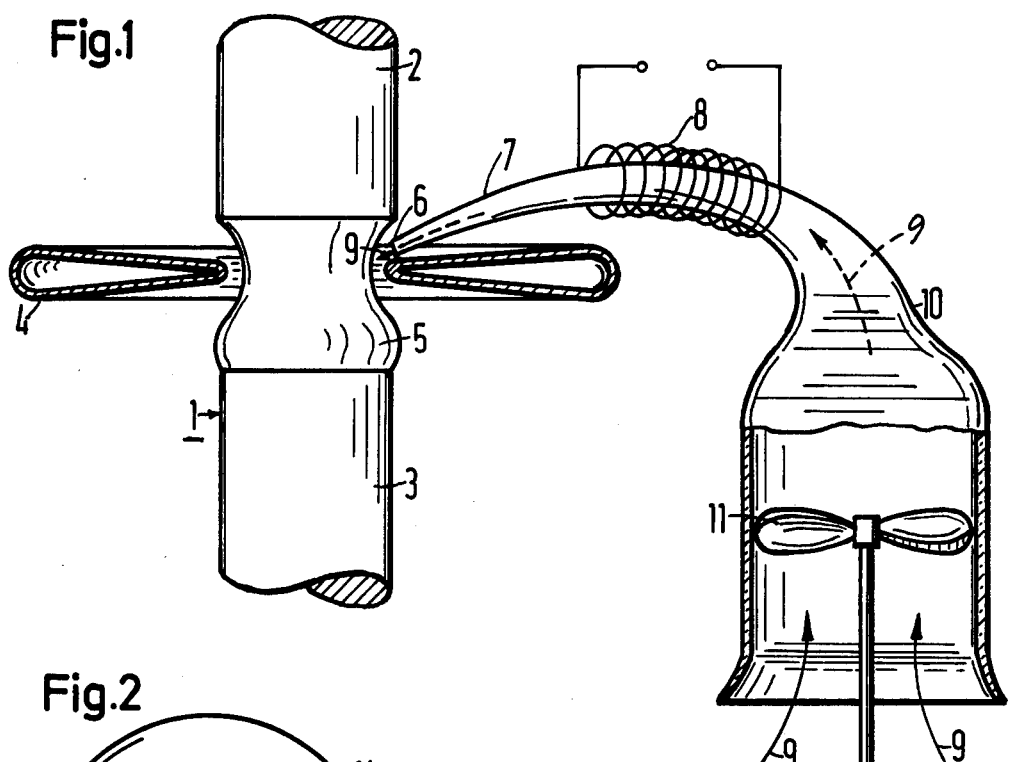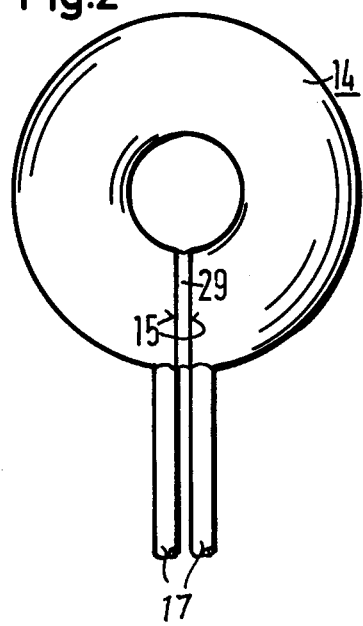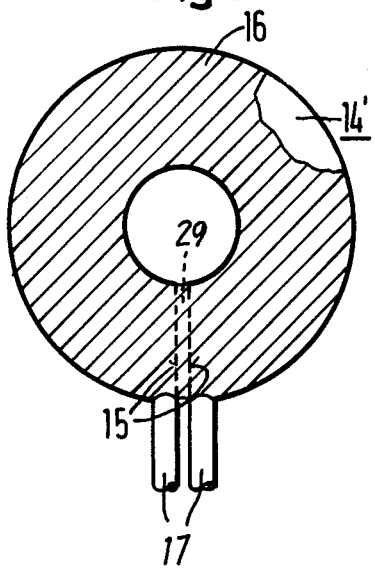

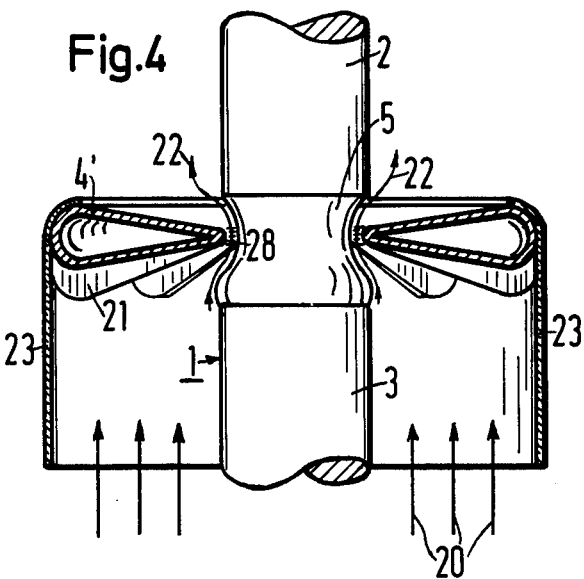
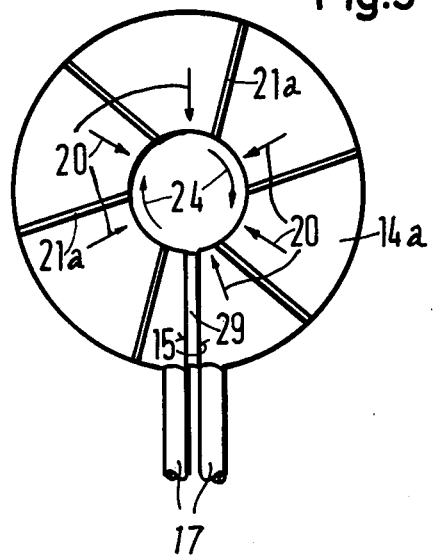
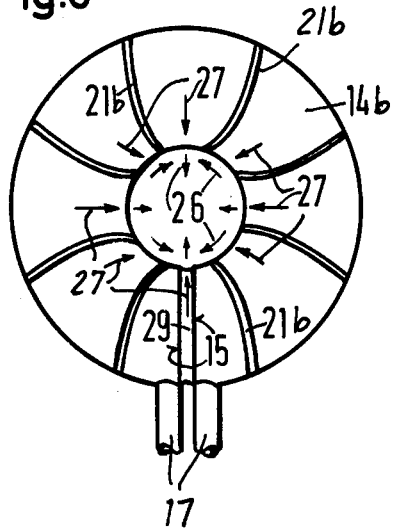

APPARATUS FOR PRODUCING A CONTROLLED RADIAL PATH OF RESISTANCE IN A SEMICONDUCTOR MONOCRYSTALLINE ROD

This is a division of application Ser. No. 460,539, filed Apr. 12, 1974, now U.S. Pat. No. 3,976,536.

BACKGROUND OF THE INVENTION

1. Field of the Invention

The invention relates to a means of controlling a radial path of resistance in a semiconductor rod and somewhat more particularly to a method and apparatus for controlling the radial path of resistance in a semiconductor rod undergoing a crucible-free zone melt treatment wherein a semiconductor rod, such as composed of silicon, is vertically supported at its ends so that an inductive heating means positioned to surround an axial portion of the rod produces a melt zone in the surrounded portion and a protective gas atmosphere is flown past the melt zone while the melt zone is moved axially along the rod to produce a monocrystalline rod having a selected radial path of resistance through a cross-section thereof.

2. Prior Art

Production of monocrystalline rods by a crucible-free zone melting process is known wherein polycrystalline semiconductor rods, particularly silicon rods, are transformed, with the aid of a seed crystal, into monocrystalline rods by moving a melt zone from the end of the polycrystalline rod attached to the seed crystal to the other end of the stock semiconductor rod. In this arrangement, the semiconductor rod is generally vertically supported by opposing rod holding means, at least one of which is rotated about the rod axis during the process so that a symmetrical growth of the re-solidified material is attained.

It is generally desirable to produce monocrystalline rods for use in semiconductor components which have very uniform values of resistance. In other words, it is desirable in the production of monocrystalline rods to very thoroughly mix the matter within the melt zone to enable dopants, etc. to be uniformly incorporated at all points of the resultant crystal lattice.

For use in producing semiconductor components, such as overhead ignitable thyristors, a basic semiconductor material is utilized which provides (111) oriented silicon crystal discs having a break or discontinuity in the electric specific resistance at the center of such a disc.

A process of producing such basic semiconductor materials is known. For example, German Offenlegungsschrift 2,204,486 or British Patent Specification 1,362,739 suggests that the radial path of resistance is controlled by supplying axially directed energy to one of the rod holding means which transmits the energy to the melt zone for mixing of matter therein. In this process, energy is transferred to the melt zone via current or sonic pulses.

Other uses of semiconductor material require a uniformly radial path of resistance without a center break and other processes may be used to produce such basic materials whereby control of the melt zone in terms of temperature distribution and material flow pattern is obtained, which in turn influences the mixing of materials therein. Thus, for example, German Pat. No. 1,218,404 discloses a process of crucible-free zone melting of a semiconductor rod in which a mutual lateral displacement of the rod holding means relative to the heating device produces an additional agitation effect in the melt zone. This agitation functions to more or less uniformly distribute dopants etc. within the recrystallized rod.

SUMMARY OF THE INVENTION

The invention provides a means of controlling a melt zone in terms of material flow speed, material flow direction and temperature distribution in such a manner that a desired radial path of resistance, either with or without a center break in the specific resistance is attained in the recrystallized semiconductor rod.

It is a novel feature of the invention to control material flow speed and direction as well as temperature distribution within a melt zone and along adjacent rod portions of a semiconductor rod undergoing a crucible-free zone melt treatment by selectively varying the flow speed, flow direction and temperature of a protective gas stream in the region of the melt zone so that a desired radial path of resistance is produced within the recrystallized semiconductor rod.

It is another novel feature of the invention to provide a single-turn flat inductive heating coil (a so-called apertured pancake coil) having the slot between adjacent terminals filled or sealed with an inert material, such as aluminum oxide or polybismaleic imide to prevent the formation of disturbing gaseous flow patterns in the region of the melt zone. In certain embodiments, the surface of such heating coil is coated with a relatively thick layer of a heat-insulating material, such as aluminum oxide, to insulate the heating coil and the surrounding gas stream from one another.

It is yet another novel feature of the invention to provide a single-turn coil of the type described above which also includes guide vanes or the like on a surface thereof facing the gas stream for directing the gas stream in a selected direction along the region of the melt zone.

Other and further objects of the present invention will be apparent from the following description and claims, and are illustrated in the accompanying drawings which, by way of illustration, show preferred embodiments of the present invention and the principles thereof and what is now considered to be the best mode contemplated for applying these principles. Other embodiments of the invention embodying the same or equivalent principles may be used and structural changes be made as desired by those skilled in the art without departing from the present invention and the spirit and scope of the appended claims.

BRIEF DESCRIPTION OF THE DRAWINGS

FIG. 1 is a partial schematic illustration of an embodiment of a device for practicing the invention wherein all components not essential to the understanding of the invention, such as a melt zone chamber, rod mounting means, coil support means, etc. have been omitted;

FIGS. 2 and 3 are, respectively, a bottom plan view and a sectional view of different embodiments of a flat (pancake) coil constructed in accordance with the principles of the invention;

FIG. 4 is a partial schematic view somewhat similar to that of FIG. 1 of another embodiment of a device for practicing the invention; and FIGS. 5 and 6 are bottom plan views of further embodiments of a flat coil constructed in accordance with the principles of the invention.

DESCRIPTION OF THE PREFERRED EMBODIMENTS

The invention provides a means of controlling material flow in a melt zone and controlling temperature distribution in the melt zone and adjacent portions of a rod undergoing a crucible-free melt zone treatment.

In accordance with the principles of the invention, flow speed, flow direction and temperature of a stream of protective gas in the region of a melt zone is regulated so that a desired radial path of resistance is attained in the recrystallized semiconductor rod.

A theory of an operative principle involved in the invention is that stability of a melt zone, radial resistance distribution and crystal structure defects such as swirls and striations are basically dependent on the material flow and temperature distribution in the melt zone itself and in adjacent rod portions. In crystal pulling processes in a protective gas atmosphere, it is possible, in contrast to crystal pulling in a vacuum, to utilize the flow speed and flow direction as well as temperature of the protective gas stream to influence the radial path of resistance and quality of the processed crystals. For example, it has been noted that the formation of a bead at the end of a conical portion of a melt zone is very dependent upon the gas flow passing through the slot of a single-turn flat coil (a so-called apertured pancake coil). Merely by orientating this slot on an angle with the horizontal plane of the coil, one is able to favorably influence the radial path of resistance in a recrystallized semiconductor rod treated with such a coil.

One embodiment of the invention comprises providing a single-turn flat coil which has the coil slot sealed or filled with an inert material, for example, sprayed-on aluminum oxide or a compound filler such as polybismaleic imide. By filling the coil slot, additional points of disturbing gas flow patterns in the region of the melt zone are avoided.

Another embodiment of the invention comprises providing a single-turn flat coil which has its surfaces coated with a relatively thick (1 to 3 mm) layer of a heat-insulating material, preferably aluminum oxide. The insulating coating is, for example, applied by a plasma spraying process and provides heat insulating to the heating coil and prevents heat transfer between the protective gas stream and the coil surfaces.

Another embodiment of the invention comprises providing a single-turn flat coil which has guide vanes or the like along a gas impinging surface of the coil. In one form of this embodiment, a gas discharge pipe is inductively heated so that a hot protective gas stream is directed against the melt zone and aids in heating the melt zone. The gas discharge nozzle is directed against the vane-carrying surface of the coil so that the stream of protective gas is compelled to move in a specific direction in the region of the melt zone.

In accordance with yet another embodiment of the invention, the molten material within a melt zone may be set into rotation by a uni-directional fanning with a protective gas stream which produces a special mixing of matter within the melt zone. By controlling the gas stream so that it blows into the melt zone from various directions, turbulence in the melt zone is achieved which provides an improved mixing of material within the melt zone. Such control is readily achieved by proper positioning of guide vanes on the coil surfaces.

This embodiment is practiced with the aid of a device which includes a single-turn flat coil within a zone melting chamber and a mobile gas line, such as a quartz tube, having a nozzle in the region of the coil. The gas supply line is provided with a means for regulating the temperature of gas flowing therethrough and with means outside the melting chamber for regulating the flow speed of gas within the supply line. Such means may comprise a motor driven compressor which regulates the flow speed of a protective gas stream or a heat-exchange means on the supply line, such as a filament winding coupled with a suitable source of energy to inductively heat gas within the supply line. Of course, the gas stream may also be cooled by arranging a cooling coil about the supply line and circulating a heat-exchange fluid, such as water, through the cooling coil.

Referring now to the drawings wherein like reference numerals are utilized to denote similar elements, FIG. 1 is a partial view of a semiconductor crystalline rod 1, such as composed of silicon, undergoing a crucible-free melt zone treatment in accordance with the principles of the invention. The rod 1 is composed of a stock or feed rod portion 2 and a recrystallized rod portion 3 coupled therewith via melt zone 5. A single-turn flat inductive heating coil 4 surrounds rod 1 and generates the melt zone 5 which is moved along the rod axis to achieve a finished product. A quartz gas line 7 is provided in the region of the heating coil 4 and has a nozzle 6 positioned adjacent the melt zone 5 to provide a directed flow of gas against the melt zone. A portion of the gas line 7 is surrounded by a filament winding 8 connected to a suitable electrical source (not shown) to heat a stream 9 of protective gas, for example argon. The flow speed of the gas stream 9 is controlled so as to be at least 1 m/sec. by a compressor 11 which is located within a gas supply line 10 positioned outside the zone melt chamber (not shown) and interconnected with gas line 7. A motor 12 operates compressor 11 in a conventional manner. A gas stream 9 flows from a suitable source (not shown) through lines 10 and 7 and impinges against the melt zone 5. As may be appreciated, material flow within the melt zone is influenced by the impinging gas stream and various flow patterns are readily established by aligning the gas nozzle 6 as desired. Of course, a plurality of gas nozzles, each having a means for providing different gas flow speeds may be utilized in the practice of the invention. The protective gas source may be a pressurized gas tank and in which case, the zone melt chamber must be provided with a gas outlet valve so as to balance the gas pressure within the chamber.

FIG. 2 shows a single-turn flat coil 14 (a so-called apertured pancake coil) having a slot 15 between adjacent coil terminals 17 which is filled with a layer 29 of an inert material, composed, for example, of polybismaleic imide, to avoid further disturbances in the flow of the gas stream in the region of a melt zone.

FIG. 3 illustrates a further embodiment of a single-turn flat coil 14' useful in the practice of the invention. Coil 14' is provided with a 1 to 3 mm thick layer 16 of a thermally insulating material, such as aluminum oxide. Layer 16 provides heat insulation and reduces cooling of the gas stream on the coil surface. The coil slot 15 is also filled with sprayed-on aluminum oxide.

In a sectional view somewhat similar to that of FIG. 1, FIG. 4 illustrates another means of influencing a flowing gas stream on a semiconductor crystalline rod. A melt zone 5 is generated on a silicon crystal rod 1 by a single-turn flat coil 4' between a feed rod section 2 and a recrystallized rod section 3. A stream 20 of a protective gas is directed upwardly in the region of the hot rod and collected by a gas hood in the form of an open-ended quartz cylinder 23 attached to a surface of coil 4'. The gas stream 20 is guided within the hood by guide vanes 21 attached to a lower surface of coil 4' toward the melt zone in a path diagrammatically indicated by arrows 22. The guide vanes 21 may be composed of sheets of quartz or metal attached to the coil surface by an adhesive or solder. The gas stream 20 is finally able to flow out of the hood upwardly through a gap 28 between adjacent surfaces of coil 4' and melt zone 5.

FIG. 5 is a bottom plan view of an embodiment of a single-turn flat coil 14a having uniformly directed vanes 21a thereon and having a coil slot 15 closed by an inert layer 29. Arrows 20 illustrate the path of gas flow when a stream of heated protective gas impinges against such a coil surface. Gas flow directed in this manner (i.e. uni-directional fanning) produces a rotating melt zone, diagrammatically indicated by arrows 24.

FIG. 6 illustrates another embodiment of a single-turn flat coil 14b having non-uniformly directed vanes 21b on a surface thereof and having a coil slot 15 closed off by an inert layer 29. Arrows 27 illustrate the path of gas flow when a stream of protective gas impinges against such a coil surface. Gas flow directed in this manner (i.e. multi-directional fanning) produces turbulence in the melt zone, diagrammatically indicated by arrows 26.

In an exemplary demonstration of the principles of the invention, the following results were achieved:

A semiconductor rod processed in accordance with crucible-free zone melt techniques and using the multi-directional guide vanes on a coil surface, such as illustrated in FIG. 6, yielded a uniform radial path of resistance across the cross-section of the finished rod (with resistivity fluctuations below 10%). A rod processed in a similar manner but with the uni-directional guide vanes on the coil surface, such as shown at FIG. 5, yielded a radial path of resistance in the center of the finished rod of approximately 40% below that present at the periphery of the rod so that a definite break in the resistivity value was present across a cross-section of the rod, rendering such rod attractive for the production of thyristors which are resistant to overhead ignition.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope and spirit of the invention as claimed.

I claim as my invention:

1. An apparatus for controlling the radial path of resistance within a semiconductor crystalline rod subjected to a crucible-free zone melt treatment, comprising:
   a housing having a hollow melt zone chamber therein;
   means within said chamber for vertically supporting a semiconductor crystalline rod by the rod ends;
   an annular inductively heating single turn flat coil having a coil slot filled with an inert material, said flat coil having a plurality of guide vanes attached to a surface thereof, said coil being positioned within said chamber to encompass an axial portion of a semiconductor rod; and
   at least one mobile gas supply line comprised of a quartz tube having a nozzle in the region of said heating coil, said gas supply line nozzle being positioned to face the surface of said coil having the guide vanes attached thereto, said gas line having means for controlling the temperature of a stream of gas flowing therein and having means for controlling the flow speed of a stream of gas therein.

2. An apparatus as defined in claim 1 wherein said flat coil includes a gas hood attached to the surface of said coil having the guide vanes attached thereto, said gas hood having an opening facing said gas supply line nozzle.

* * * * *